(12) United States Patent
Giles

(10) Patent No.: US 7,887,634 B2
(45) Date of Patent: Feb. 15, 2011

(54) METHOD OF PRODUCING A SEMICONDUCTOR ELEMENT AND SEMICONDUCTOR ELEMENT

(75) Inventor: Luis-Felipe Giles, Munich (DE)

(73) Assignee: Infineon Technologies AG (DE)

( * ) Notice: Subject to any disclaimer, the term of this patent is extended or adjusted under 35 U.S.C. 154(b) by 1073 days.

(21) Appl. No.: 11/615,592

(22) Filed: Dec. 22, 2006

(65) Prior Publication Data

US 2008/0149929 A1 Jun. 26, 2008

(51) Int. Cl.
*C30B 21/02* (2006.01)

(52) U.S. Cl. .......................... 117/84; 117/89; 117/104; 117/105

(58) Field of Classification Search .................. 117/84, 117/89, 104, 105
See application file for complete search history.

(56) References Cited

U.S. PATENT DOCUMENTS

2007/0161219 A1 7/2007 Giles

FOREIGN PATENT DOCUMENTS

DE 10 2005 054 218 A1 5/2007

OTHER PUBLICATIONS

International Technology Roadmap for Semiconductors, 2005 Edition, Front End Processes.
Lerch, W. et al; "Advanced Activation of Ultra-shallow Junctions using flash-assisted RTP"; European Materials Research Society (EMRS); EMRS Proceedings 2005.
Giles, L.F. et al; "Transient enhanced diffusion of B at low temperatures under extrinsic conditions"; Solid-State Electronics 49 (2005), pp. 618-627.
Colombeau, B. et al; "Electrical Deactivation and Diffusion of Boron in Preamorphized Ultrashallow Junctions: Interstitial Transport and F co-implant Control"; Proceedings IEDM 2004, pp. 971-974.
Mannino, G. et al; "Electrical activation of B in the presence of boron-interstitials cluster"; Applied Physics Letters, vol. 79, No. 23, Dec. 3, 2001, pp. 3764-3766.
Kennel, H.W. et al; "Modeling of Ultrahighly Doped Shallow Junctions for Aggressively Scaled CMOS"; Proceedings IEDM 2002.
Laveant, P; "Carbon-rich crystalline silicon: Considerations on the growth, diffusion, precipitation and lattice engineering"; PhD Thesis, Martin-Luther-University Halle-Wittenberg (2001).
Yasutake, K. et al; "Oxygen Precipitation and Microdefects in Czochralski-Grown Silicon Crystals"; Physica Status Solidi (a), 83, pp. 207-217, (1984).

Primary Examiner—Robert M Kunemund
(74) Attorney, Agent, or Firm—Dickstein Shapiro LLP

(57) ABSTRACT

In a method of producing a semiconductor element in a substrate, a plurality of carbide precipitates is formed in the substrate, doping atoms are implanted into the substrate, thereby forming crystal defects in the substrate, the substrate is heated, such that at least a part of the crystal defects is eliminated using the carbide precipitates, and the semiconductor element is formed using the doping atoms.

31 Claims, 14 Drawing Sheets

FIG 5
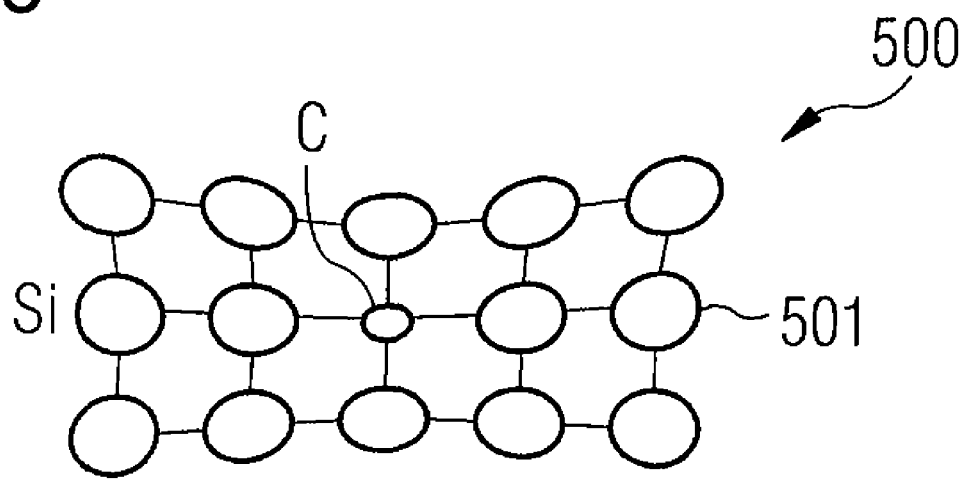
SiC or
C agglomerate
Volume reduction
(factor 2)
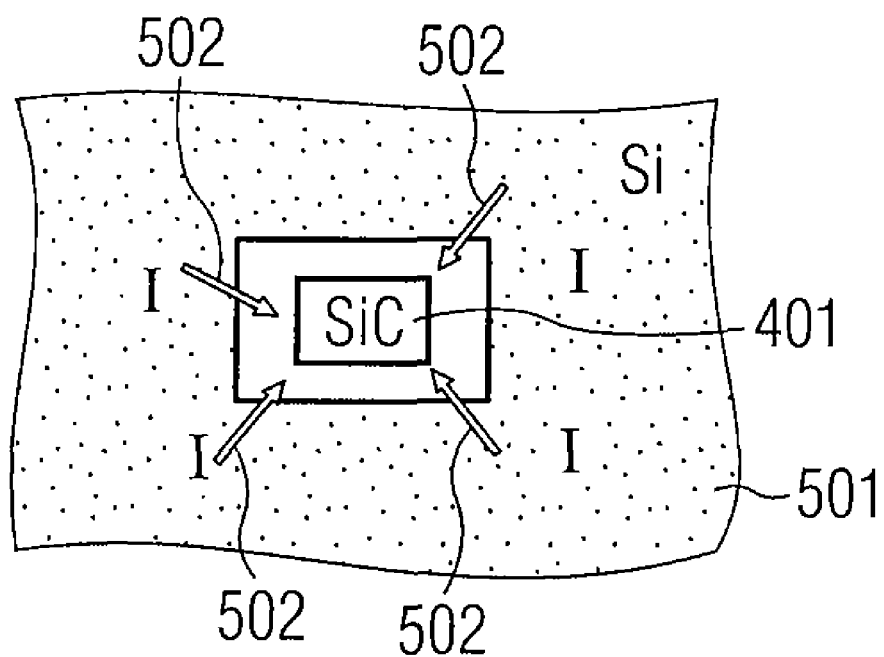

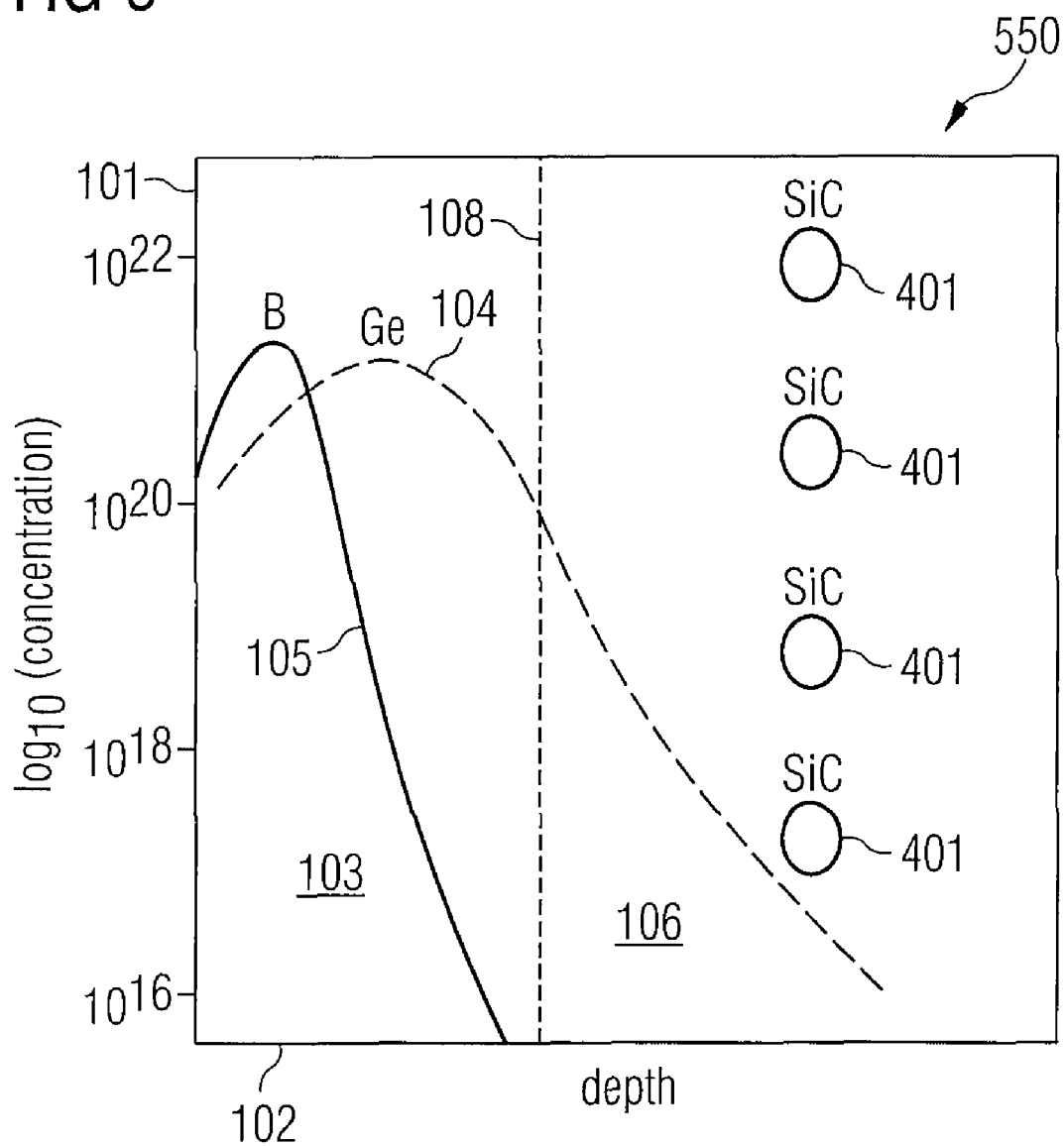

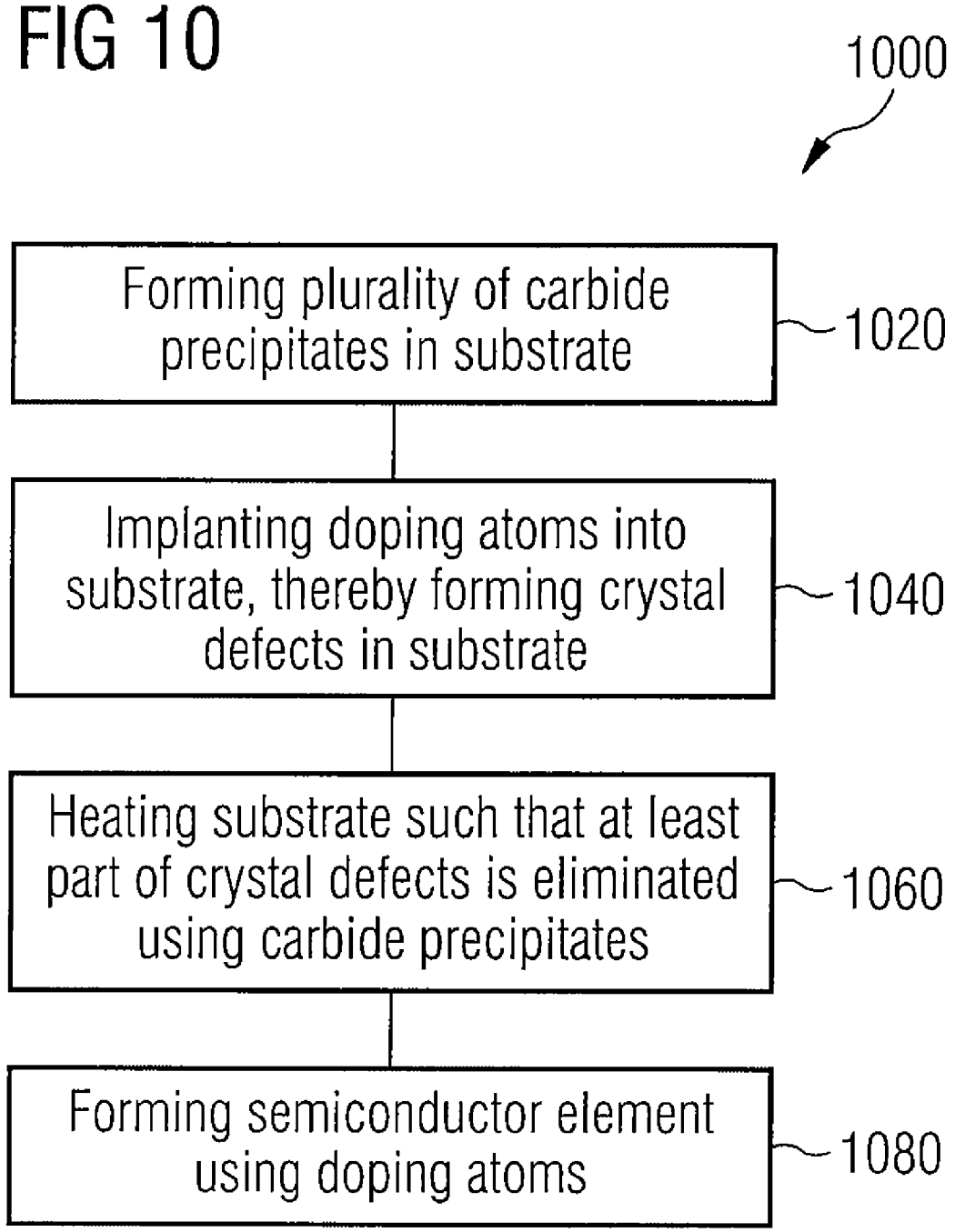

METHOD OF PRODUCING A SEMICONDUCTOR ELEMENT AND SEMICONDUCTOR ELEMENT

BACKGROUND OF THE INVENTION

The invention relates to a method of producing a semiconductor element and to a semiconductor element.

It is desirable to reduce the number of crystal lattice defects within semiconductor elements.

BRIEF DESCRIPTION OF THE FIGURES

In the following description, various embodiments of the invention are described with reference to the following drawings. In the figures, like reference characters generally refer to the same parts throughout the different views. The drawings are not necessarily to scale, emphasis instead generally being placed upon illustrating the principles of the invention.

In the drawings:

FIG. 4 to FIG. 6 show diagrams that illustrate functional principles according to certain embodiments of the invention;

FIG. 10 shows a method of producing a semiconductor element in accordance with another embodiment of the invention.

DETAILED DESCRIPTION OF THE INVENTION

Figure 1:
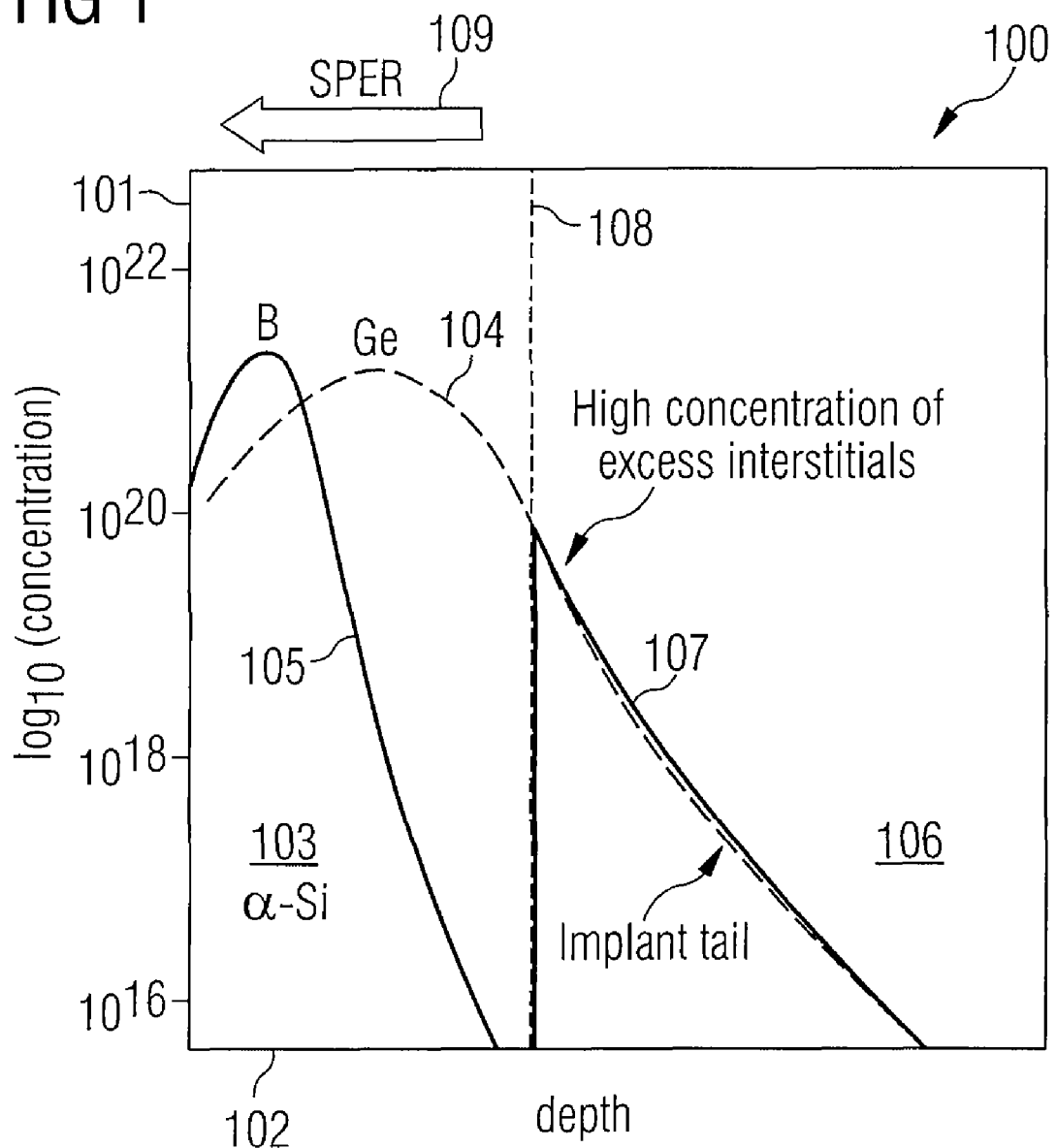
FIG. 1 shows a diagram that illustrates a conventional pre-amorphization of a substrate.

According to the International Technology Roadmap for Semiconductors (ITRS), 7 nm deep ultra-shallow junctions with sheet resistances less than 1000 $\Omega/\square$ (ohms per square) would be required for the 45 nm technology node and beyond. Current techniques to achieve these shallow junctions include implanting low energy boron (or boron fluoride, $BF_2$) as dopants into germanium (Ge) pre-amorphized silicon layers. In order to anneal the implantation damage and activate the dopants, a subsequent high-temperature annealing step ($T \geq 1300°$ C.) using ultra-fast techniques such as laser and flash annealing is usually carried out. These methods usually involve dopant deactivation during subsequent low-temperature processes as well as an undesirable transient enhanced diffusion (TED).

It is now widely accepted that both the dopant deactivation and TED are caused by a self-interstitial (I) supersaturation produced by the implantation process itself.

In the context of this application, the term "self-interstitial" refers to a specific type of one-dimensional point defect in a crystal lattice. In particular, a "self-interstitial" is meant to be an atom lodged in a position between normal lattice atoms, that is in an interstice. The qualification "self" indicates, that the interstitial atom is of the same type as the normal lattice atoms. For example, in a silicon substrate, a self-interstitial would refer to a silicon atom sitting at an interstice. In the following description, the terms "self-interstitial", "interstitial" and "interstitial-type defect" are used interchangeably.

It is widely accepted that the dopant deactivation (for example, the boron deactivation) at low temperatures occurs due to the formation of immobile dopant-interstitial clusters (e.g., boron-interstitial clusters). The source of interstitials required for the formation of dopant-interstitial clusters is to be seen in the end-of-range (EOR) damages located close to the original interface between the amorphous region and the crystalline region of the silicon substrate (this interface also being referred to as amorphous/crystalline silicon interface). For this reason, these interstitial-type defects are also termed EOR defects.

One way to eliminate both phenomena mentioned above (i.e., TED and dopant deactivation) is to completely suppress the source of interstitials.

Conventional methods to reduce TED and dopant deactivation include the use of cocktail implants ($BF_2$, C, F) in conjunction with Ge pre-amorphization. Since both F (fluorine) and C (carbon) are known to diffuse through an interstitial-type mechanism, the coupling of F (or C) with interstitials may help to reduce the overall self-interstitial supersaturation responsible for TED. However, the cocktail implant approach is not able to completely suppress TED because it does not completely eliminate the source of the problem which in fact is the excess self-interstitials located at the original crystalline/amorphous interface.

In accordance with one embodiment of the invention, a method of producing a semiconductor element in a substrate is provided. The method includes forming a plurality of carbide precipitates in the substrate. The method further includes implanting doping atoms into the substrate, thereby forming crystal defects in the substrate. The method further includes heating the substrate, such that at least a part of the crystal defects is eliminated using the carbide precipitates. The semiconductor element is formed using the doping atoms.

In accordance with another embodiment of the invention a semiconductor element is provided. The semiconductor element includes a substrate, at least one shallow junction formed in the substrate, doping atoms in the shallow junction, and a plurality of carbide precipitates formed in the substrate below the at least one shallow junction.

In accordance with one embodiment of the invention, the substrate includes silicon. According to one embodiment, the substrate may be a silicon substrate, for example a (100) silicon substrate or a (111) silicon substrate.

According to one embodiment of the invention, the substrate is a single crystalline substrate.

In accordance with another embodiment of the invention, at least one of the plurality of carbide precipitates has a length of approximately between 4 nm and 120 nm, for example 10 nm, a width of approximately between 4 nm and 120 nm, for example 10 nm, and a height of approximately between 4 nm and 120 nm, for example 10 nm.

In accordance with another embodiment of the invention, at least one of the carbide precipitates is approximately spherical in shape, having, for example, a radius between approximately 2 nm and 60 nm.

In accordance with another embodiment of the invention, the plurality of carbide precipitates are formed in such a way, that they form a band of carbide precipitates, the carbide precipitates being separated from one another.

The band structure may be achieved, for example, by a conservative ripening process, wherein from a large number of small precipitates a smaller number of bigger precipitates is formed, in that clearly two or more small precipitates "merge" into one bigger precipitate. The ripening process may be initiated, for example, by means of a thermal treatment or anneal, e.g. with a low thermal budget.

In accordance with another embodiment of the invention, the band of precipitates has a thickness, in other words an extent in the direction of the surface normal, of approximately between 20 nm and 200 nm, for example 100 nm. In one embodiment, the precipitates in the band structure may have, for example, a size of approximately 10 nm.

In accordance with another embodiment of the invention, carbon ions, for example $C^+$ ions, are implanted into the substrate, such that the plurality of carbide precipitates are formed in the substrate.

In accordance with another embodiment of the invention, the carbon ions are implanted with an implantation dose of approximately between $10^{14}$ $cm^{-2}$ und $10^{18}$ $cm^{-2}$, for example with an implantation dose of approximately $10^{16}$ $cm^{-2}$.

In accordance with another embodiment of the invention, the carbon ions are implanted in such a way that they have an energy of approximately between 10 keV and 100 keV during implantation, for example approximately 50 keV.

In accordance with another embodiment of the invention, the projected range of the implanted carbon ions is such, that the implanted carbon ions are at a distance of approximately between 20 nm and 200 nm, for example 100 nm, from an active region of the semiconductor element. In other words, the concentration peak of the implanted carbon ions is about 20 nm to 200 nm away from the active region of the semiconductor element.

In accordance with another embodiment of the invention, the substrate with the implanted carbon ions is subjected to a thermal treatment, in other words a tempering step or annealing step, such that the carbide precipitates are formed. According to one embodiment, the thermal treatment may be carried out using a low thermal budget.

In accordance with another embodiment of the invention, the substrate is heated to a temperature of approximately between 600° C. and 1000° C., for example 900° C., during the thermal treatment.

In accordance with another embodiment of the invention, the substrate is heated for a duration of approximately between 5 minutes and 4 hours, for example 10 minutes, during the thermal treatment.

In accordance with another embodiment of the invention, the substrate is at least partially pre-amorphized. For example, according to one embodiment, a surface region of the substrate is pre amorphized, according to one embodiment for example up to a depth of approximately 50 nm to 200 nm, e.g. 100 nm. In other words, according to this embodiment a surface region of the substrate having a thickness of approximately 50 nm to 200 nm, e.g. 100 nm, is amorphized, while a substrate region below the amorphized region remains crystalline.

In accordance with another embodiment of the invention, pre amorphization ions are used for the pre-amorphization of the substrate. In accordance with one embodiment of the invention, germanium ions (for example, $Ge^+$ ions) or silicon ions (for example, $Si^+$ ions) are used as pre-amorphization ions for the pre-amorphization.

In accordance with one embodiment of the invention, the pre-amorphization ions (for example $Ge^+$ ions) are implanted using an implantation dose of approximately between $10^{14}$ $cm^{-2}$ and $10^{16}$ $cm^{-2}$, for example an implantation dose of approximately $10^{15}$ $cm^{-2}$.

In accordance with one embodiment of the invention, the pre-amorphization ions (e.g. $Ge^+$ ions) are implanted in such a way that they have an energy of approximately between 10 keV and 100 keV during implantation, for example approximately 60 keV.

In accordance with another embodiment of the invention, the carbide precipitates are formed near an interface between a crystalline region and an amorphous region of the substrate formed by the partial pre-amorphization of the substrate, the interface also being referred to as an amorphous/crystalline interface. For example, in one embodiment the average distance between the carbide precipitates (e.g. the SiC precipitates) and the amorphous/crystalline interface is approximately 10 nm to 20 nm. In other words, according to this embodiment the carbide precipitates remain approximately 10 nm to 20 nm deeper than the amorphous/crystalline interface. In an alternative embodiment of the invention, the carbide precipitate region is formed approximately 50 nm deeper than the amorphous/crystalline interface. However, in accordance with other embodiments of the invention, the distance between the carbide precipitates and the amorphous/crystalline interface may have a different value.

In accordance with another embodiment of the invention, the substrate is partially pre-amorphized after the formation of the carbide precipitates. In other words, according to this embodiment the carbide precipitates are formed prior to a pre-amorphization of the substrate.

In accordance with another embodiment of the invention boron atoms, phosphorus atoms or arsenic atoms are implanted into the substrate as doping atoms.

In accordance with another embodiment of the invention, the boron atoms are implanted into the substrate by introducing boron ions (e.g. $B^+$ ions) into the substrate or by introducing boron fluoride ions (e.g. $BF_2^+$ ions) into the substrate, or by introducing boron clusters (e.g., $B_xH_y^+$) into the substrate.

In accordance with one embodiment of the invention, the doping atoms (e.g. the boron ions) are implanted in such a way that they have an energy of approximately between 0.1 keV and 2 keV during implantation, for example approximately 0.5 keV.

In accordance with another embodiment of the invention at least one region, within which region the doping atoms are implanted into the substrate, forms a shallow junction of the semiconductor element. In other words, according to this embodiment at least one region of the substrate, which is doped by implantation of doping atoms into that region, forms a shallow junction of the semiconductor element.

In accordance with another embodiment of the invention, at least one shallow junction of the semiconductor element is formed as an ultra-shallow junction.

In accordance with another embodiment of the invention the semiconductor element is a transistor, for example a field effect transistor.

In accordance with another embodiment of the invention at least one region, within which region the doping atoms are implanted into the substrate, forms a source region or a drain region of the field effect transistor.

In accordance with another embodiment of the invention a first region, within which the doping atoms are implanted into the substrate, forms a source region of the field effect transistor, and a second region, within which the doping atoms are implanted into the substrate, forms a drain region of the field effect transistor.

In accordance with another embodiment of the invention, the carbide precipitates are formed prior to the formation of a gate insulator of the field effect transistor. In other words, the gate insulator of the field effect transistor may be formed after the formation of the carbide precipitates.

According to one embodiment of the invention, silicon carbide precipitates are formed from carbon atoms implanted into a silicon substrate. At low concentrations, carbon atoms are substitutionally incorporated into the crystal lattice of a silicon substrate. Since the atomic radius of carbon is considerably smaller than the atomic radius of silicon (0.77 Å (Angström) compared to 1.17 Å), the crystal lattice will be locally perturbed or distorted (that is, in the vicinity of the substitutional carbon atom). The solid solubility $C_s$ of carbon in silicon has been experimentally measured by infrared (IR) spectroscopy to be approximately $$C_s = 3.9 \times 10^{24} \exp(-2.3 \text{ eV}/(k_B T)) \text{ cm}^{-3} \tag{1}$$

wherein in Eq. (1), T denotes temperature (in Kelvin), $k_B$ is Boltzmann's constant and e is the electron charge.

For example, according to Eq. (1), for a temperature of 900° C. the solubility of carbon in silicon is on the order of $10^{15}$ cm$^{-3}$. In other words, approximately $10^{15}$ carbon atoms per cubic centimeter may be substitutionally incorporated into the silicon crystal lattice at this temperature.

Above the solubility limit $C_s$, carbon precipitates mainly into a SiC phase. The main prerequisites for SiC precipitation are a high carbon concentration and a high interstitial concentration.

Due to the smaller atomic radius of C, compared with that of silicon, precipitation of SiC involves the contraction of the structure by a factor of 2. In other words, a local volume reduction by a factor of 2 results from the SiC precipitate formation. This volume change may be accommodated either elastically (i.e. by an elastic deformation of the lattice structure), or by the capture and emission of point defects.

In accordance with another embodiment of the invention, the at least one shallow junction is formed within an amorphous region of the substrate.

In accordance with another embodiment of the invention, the at least one shallow junction forms the source region of the field effect transistor or the drain region of the field effect transistor.

In accordance with another embodiment of the invention, a layer having a high density of silicon carbide (SiC) precipitates is formed near an amorphous/crystalline interface within a substrate of a semiconductor element. According to an embodiment of the invention, SiC precipitates are nucleated in one or more regions of a semiconductor element (e.g., a semiconductor device, for example, a field effect transistor) where a high self-interstitial population co-exists with a high carbon concentration. Since SiC precipitation in silicon is followed by a local volume contraction, the volume change is generally accommodated by the emission or absorption of point defects. Indeed, a SiC precipitate either injects vacancies or absorbs self-interstitials into the surrounding matrix making the SiC precipitate a perfect sink for excess interstitials located at the amorphous/crystalline interface.

According to another embodiment of the invention, a deep carbon implant is integrated into a conventional CMOS (complementary metal oxide semiconductor) process, the deep carbon implant being used to create a SiC precipitate layer located near an end-of-range (EOR) region. In one embodiment, contrary to the conventional cocktail implant approach the carbon ions are implanted prior to the Ge pre-amorphization step with a very high dose (for example approximately $10^{-16}$ cm$^{-2}$) and a high energy (for example approximately 50 keV). Furthermore, in order to fully anneal the implanted damage and enhance the SiC nucleation process, a thermal treatment may be carried out (for example at a temperature of, for example, T=900° C., and for a duration of, for example, approximately 10 minutes) before the Ge pre-amorphization is carried out.

In accordance with an embodiment of the invention, the Ge pre-amorphization process may be tuned (or optimized) in order that the SiC precipitate region remains, for example, about 50 nm deeper than the amorphous/crystalline interface (α/Si interface). In this way the SiC precipitate region can be placed relatively close to the high self-interstitial supersaturation but at the same time not close enough to the α/Si interface to affect the Solid Phase Epitaxial Regrowth (SPER) process. As previously indicated, the SiC precipitate region (e.g., the SiC precipitate band) may act as an effective sink for interstitials, thereby drastically reducing the overall interstitial supersaturation. The SiC precipitates may be formed far enough from the p+/n junction such that no deleterious effect of the method on the device performance is expected.

In a method of producing a semiconductor element according to one exemplary embodiment of the invention, only slight modifications in the process flow of a conventional CMOS process are needed. In other words, the method can be easily integrated into the CMOS process flow. For example, forming the SiC precipitate band deeper than the p+/n junction can be achieved by increasing the energy of the pre-amorphization implants. According to one embodiment, the SiC precipitate band can be integrated within the P-LDD (lightly doped drain) construction. In this case, no additional process step is needed. According to another embodiment, the SiC precipitate band can be integrated before the gate oxidation process. In this case, the gate oxide integrity can be maintained.

In accordance with another exemplary embodiment of the invention, by eliminating the source of interstitials responsible for transient enhanced diffusion (TED), conventional rapid thermal processing (RTP) methods can advantageously be used for a thermal treatment instead of expensive and unreliable ultra-fast thermal processes (such as e.g. laser or flash annealing). For example, the SiC precipitates remain stable even after the high temperature RTP processes.

According to one embodiment of the invention, TED and boron deactivation are drastically reduced or even completely suppressed during the fabrication of a semiconductor element as a consequence of recombination of interstitials into a band of carbide precipitates (e.g. SiC precipitates).

In accordance with another embodiment of the invention, a method of producing a semiconductor element is provided, the method being fully compatible with current bulk silicon CMOS technology.

FIG. 1 shows in a first diagram 100 an ion concentration (in logarithmic representation ($\log_{10}$)) in a silicon substrate, plotted along the ordinate 101 of the diagram 100, the ion concentration depending on the depth into the substrate, plotted along the abscissa 102 of the diagram 100, wherein the main processing surface of the substrate is represented by a straight line coinciding with the ordinate 101 of the diagram 100.

In the diagram 100, it is assumed that a surface region 103 (α-Si) of the substrate has been germanium pre-amorphized using germanium ions (Ge$^+$) as implantation ions (in the diagram 100, a concentration profile of the implanted germanium atoms is represented by a first curve 104). It is furthermore assumed, that after the pre-amorphization having been carried out, boron atoms (B atoms) have been implanted into the substrate, for example by means of introducing boron ions (e.g. B⁺ ions) or introducing boron fluoride ions ($BF_2^+$) into the substrate (in the diagram 100, a concentration profile of the boron atoms is represented by a second curve 105). As can be inferred from FIG. 1, the Ge⁺ ion implantation into the substrate has been carried out in such a way, that after the implantation both the amorphized region 103 and the crystalline region 106 of the substrate contain germanium (cf. Ge concentration curve 104). During the implantation of the Ge⁺ ions into the crystalline region 106 of the substrate, crystal lattice damages (also termed crystal lattice defects) are created. Thus, inter alia interstitial-type defects or interstitials (symbolized by means of a third curve 107 in FIG. 1) are formed within the crystalline region 106 of the substrate as a result of the implantation of germanium ions.

Figure 2:
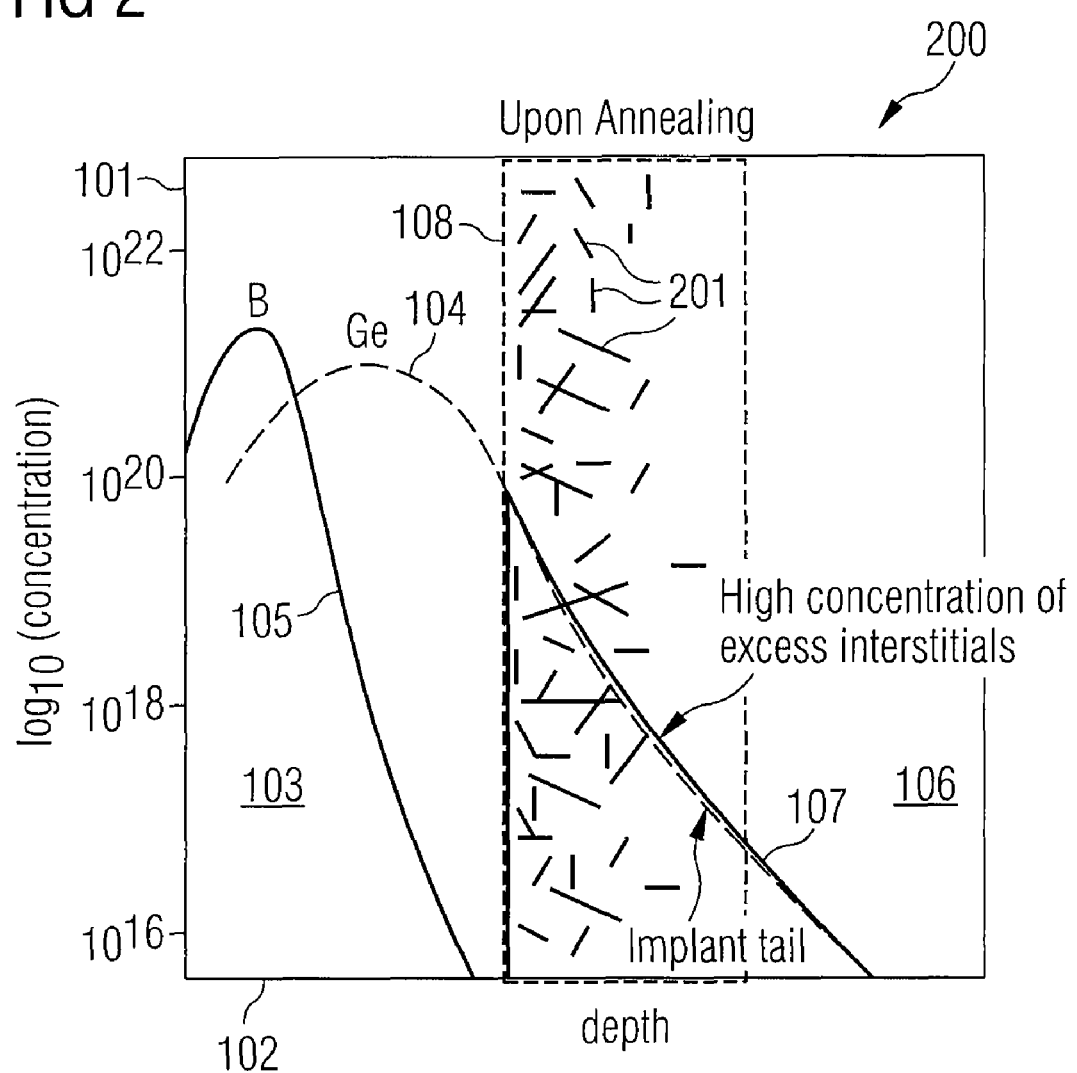
FIG. 2 shows a diagram that illustrates a conventional annealing of the pre-amorphized substrate shown in FIG. 1 as well as the formation of interstitials as a result of the annealing.

If subsequently an annealing process at a temperature of about 600° C. to 700° C. is carried out in order to enable a re-crystallization of a portion of the region 103 having been amorphized before, during a solid phase epitaxial regrowth (SPER) process as indicated by the arrow 109 in FIG. 1, then, although some of the interstitials are eliminated, however not all of them are eliminated. Particularly in a border region at the interface 108 between the amorphous region 103 and the crystalline region 106, so-called end-of-range interstitial-type defects 201 (end-of-range defects, EOR defects) remain (see second diagram 200 in FIG. 2). In other words, even after the SPER step, end-of-range interstitial damages still remain in the tail of the implant profile (implant tail, cf. FIG. 1).

It has to be noted that the interstitial-type defects 201 are a cause for TED of boron atoms, and are furthermore a cause for an undesirable deactivation of the boron atoms. In other words, both the deactivation of the boron atoms and the TED are a consequence of one and the same driving mechanism, namely the supersaturation of crystal lattice defects created by means of the implantation process.

Figure 3:
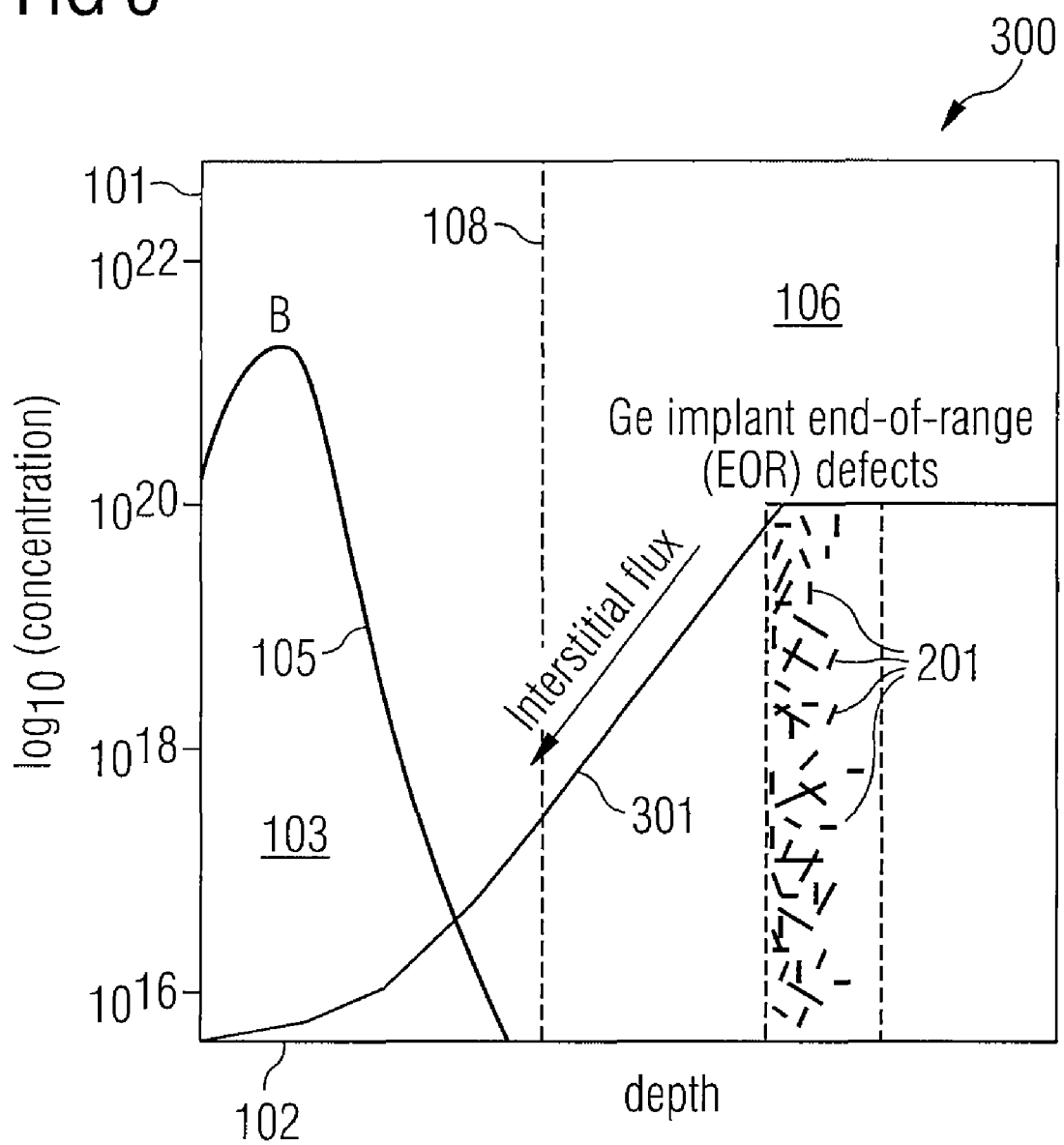
FIG. 3 shows a diagram that illustrates a conventional flux of interstitials created according to FIG. 2, in the direction towards a region doped with dopant atoms.

It has furthermore to be noted that the interstitial-type defects 201 partly diffuse in the direction towards the main processing surface of the substrate and thus in the direction towards the amorphous region 103 (compare fourth curve 301 and the arrow labelled "Interstitial flux" in a third diagram 300, shown in FIG. 3).

Figure 4:
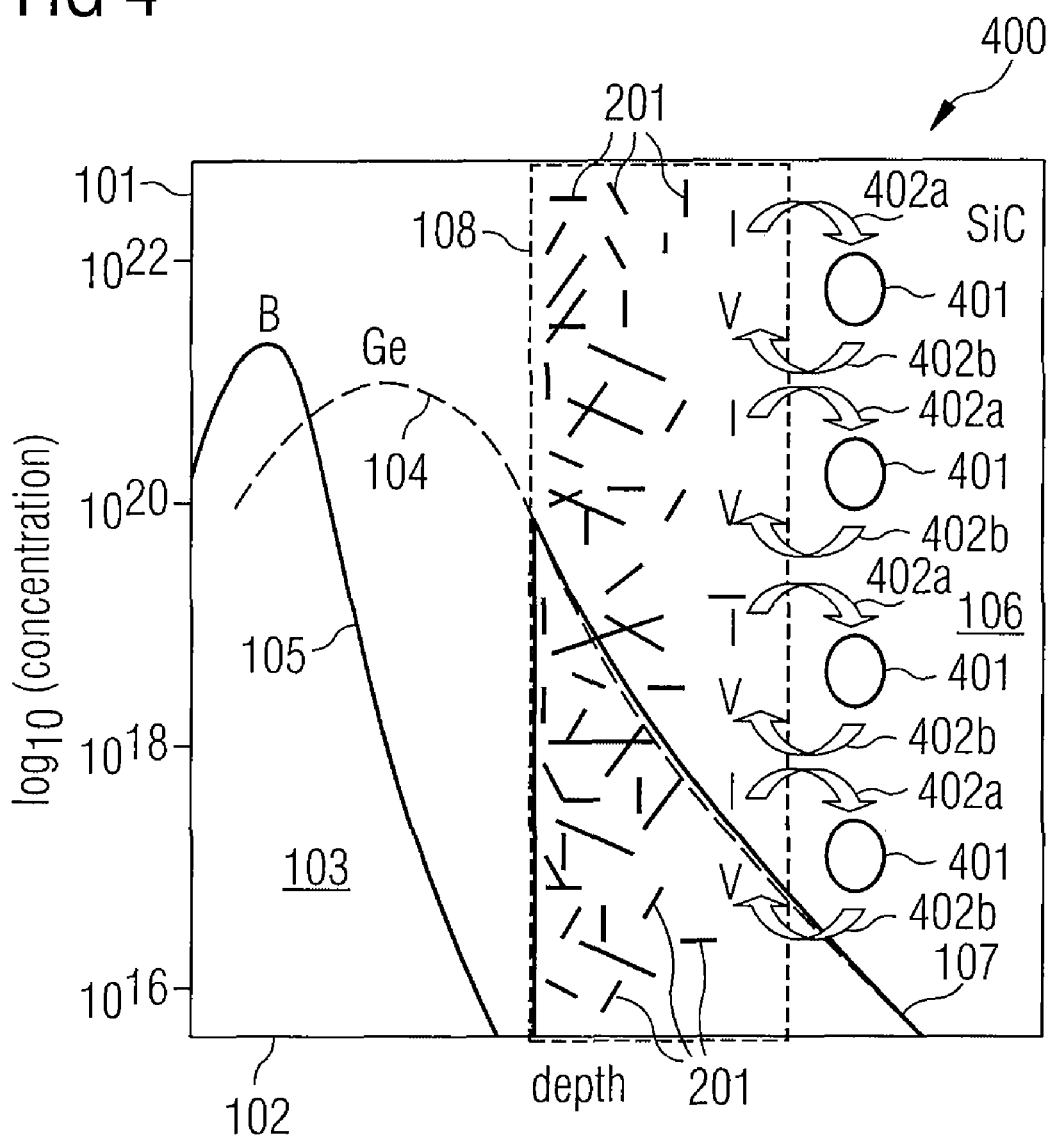

According to one embodiment of the invention, it is provided that, as is shown in a fourth diagram 400 in FIG. 4, beneath the region in which the boron atoms (in general, the doping atoms) are introduced into the substrate, silicon carbide (SiC) precipitates 401 are formed in the crystalline region 106 of the substrate (for example beneath the amorphous region 103 if such a region is provided).

FIG. 5 shows in a fifth diagram 500 that the formation of silicon carbide precipitates 401, for example by implantation of a high dose of carbon into a silicon substrate 501 (e.g. an implantation dose above the solid solubility limit of carbon, cf. above), results in a local volume reduction of the silicon crystal 501 by a factor of 2. As mentioned above, this volume reduction may then be accommodated either by elastic deformation or by the capture and emission of point defects. In other words, the SiC precipitates 401 may serve as sinks for interstitial-type point defects or interstitials (I), as is symbolized by the arrows 502 in FIG. 5.

As shown in FIG. 4, the silicon carbide precipitates 401 are formed within local proximity of the interstitial-type defects (interstitials) 201 to be expected and being formed later, wherein the silicon carbide precipitates 401 are formed so close to the later-formed interstitials 201 that they serve as a sink for the interstitials 201.

In other words, the interstitial-type defects 201 are dissolved by means of the silicon carbide precipitates 401, in still other words the interstitials 201 are eliminated by means of the SiC precipitates 401. This process is symbolized by arrows 402a, 402b in the fourth diagram 400 in FIG. 4. Clearly, the SiC precipitates 401 serve as sinks for the interstitials (I), which is represented by the arrows 402a, by forming a source of vacancies (V), which is represented by the arrows 402b.

The elimination process is carried out as a temperature-supported process using a rapid thermal anneal (RTA). Thus, a very simple standard mechanism can be used for eliminating at least partially the undesired interstitial-type defects 201.

According to this embodiment of the invention, a laser annealing or flash annealing is thus not required anymore. However, if desired, also a laser or flash annealing can be carried out in accordance with alternative embodiments of the invention.

FIG. 6 represents symbolically in a sixth diagram 550 the final state after the elimination of the interstitial-type defects 201, wherein it is assumed that after the elimination of the interstitial-type defects 201, some silicon carbide precipitates 401 are still present in the substrate. In other words, only SiC precipitates 401 remain deep in the substrate after the RTP process. The self-interstitial supersaturation is reduced.

Figure 7A:
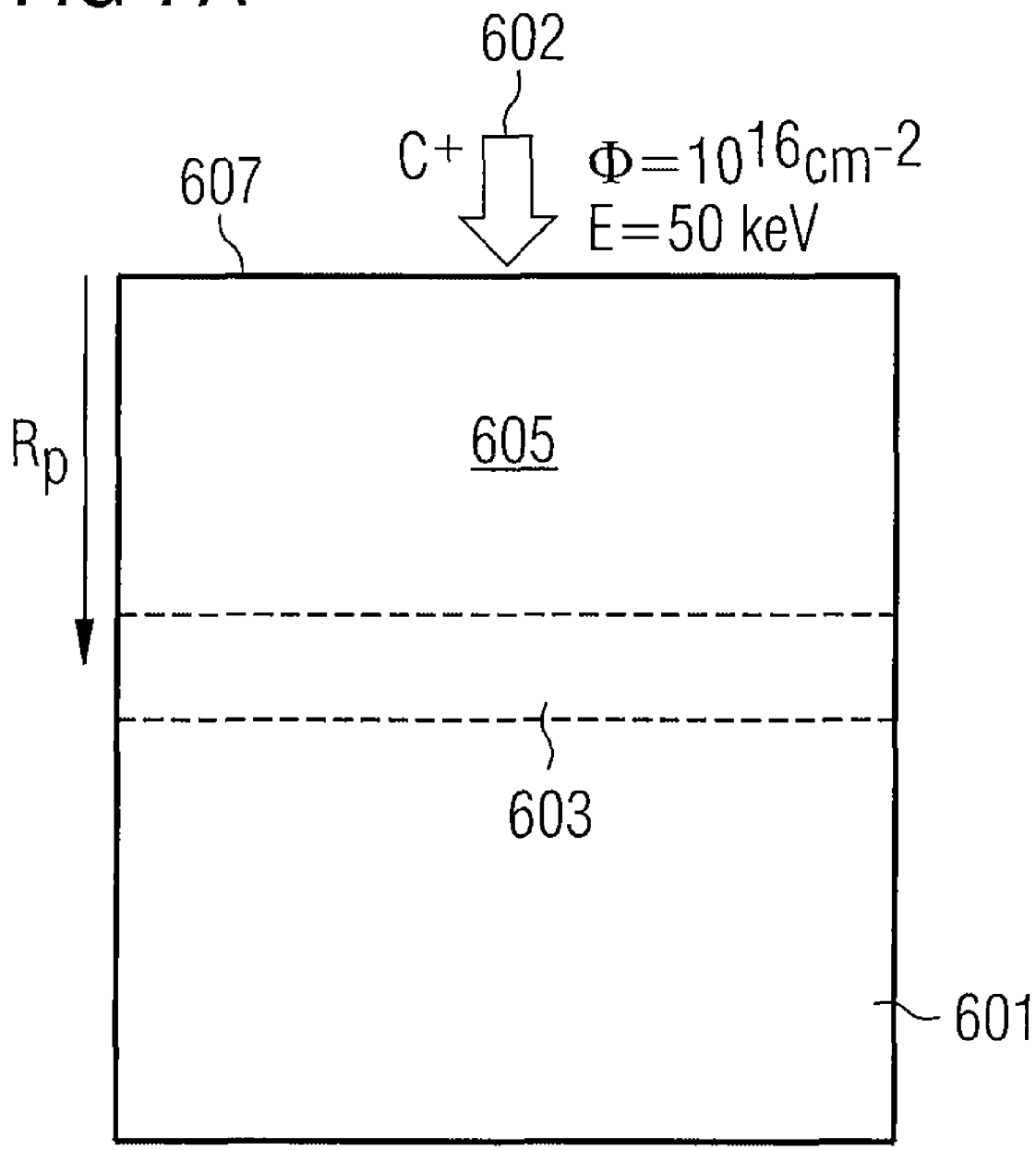
FIG. 7A to FIG. 7D show different process steps of a method of producing a semiconductor element in accordance with another embodiment of the invention.

FIG. 7A shows a process step of a method of producing a semiconductor element in accordance with an embodiment of the invention. In accordance with this embodiment, a field effect transistor is produced.

It is shown the implantation of carbon ions 602, in this case C⁺ ions 602, into a silicon (Si) substrate 601. The substrate may be, for example, a Si (100) substrate or a Si (111) substrate. According to the embodiment shown, the implantation of the carbon ions 602 is carried out using an implantation dose $\Phi=10^{16}$ cm⁻² and an implantation energy E=50 keV. By means of the implanted carbon ions 602 a high density or concentration of carbon atoms 603 is formed at a predeterminable depth within the silicon substrate 601 below the substrate surface 607. The concentration maximum of the implantation profile is located at the projected range $R_p$. In other words, the implanted carbon atoms 603 are distributed within the silicon substrate 601 around the concentration maximum (projected range $R_p$). $R_p$ and thus the implantation depth of the carbon ions 602 can be tuned (in other words modified) by changing, for example, the parameters implantation dose ($\Phi$) and energy (E). The parameters $\Phi$ and E can be chosen in such a way, that silicon carbide precipitates, which will be formed in a later process step, are formed below a channel region 605 of the transistor (in accordance with alternative embodiments, below an active region of the semiconductor element) to be formed.

By means of a high-dose carbon implant both a high concentration of carbon atoms and a high concentration of interstitials can be formed within the silicon substrate. By means of the high concentration of both carbon atoms and self-interstitials, silicon carbide (SiC) precipitation can be initiated in the silicon substrate.

If required, a hard mask comprising, for example, an oxide layer and a nitride layer formed on the oxide layer, can be used, which is patterned in such a way, that the lateral extension of the region into which the carbon ions 602 are implanted, is restricted to an area of source/drain regions to be formed later as highly doped ultra-shallow junctions. In other words, by means of the hard mask it is made possible to form SiC precipitates only below the source/drain regions of the field effect transistor. The mask may have a similar size as the desired lateral extension of the source/drain regions.

Figure 7B:
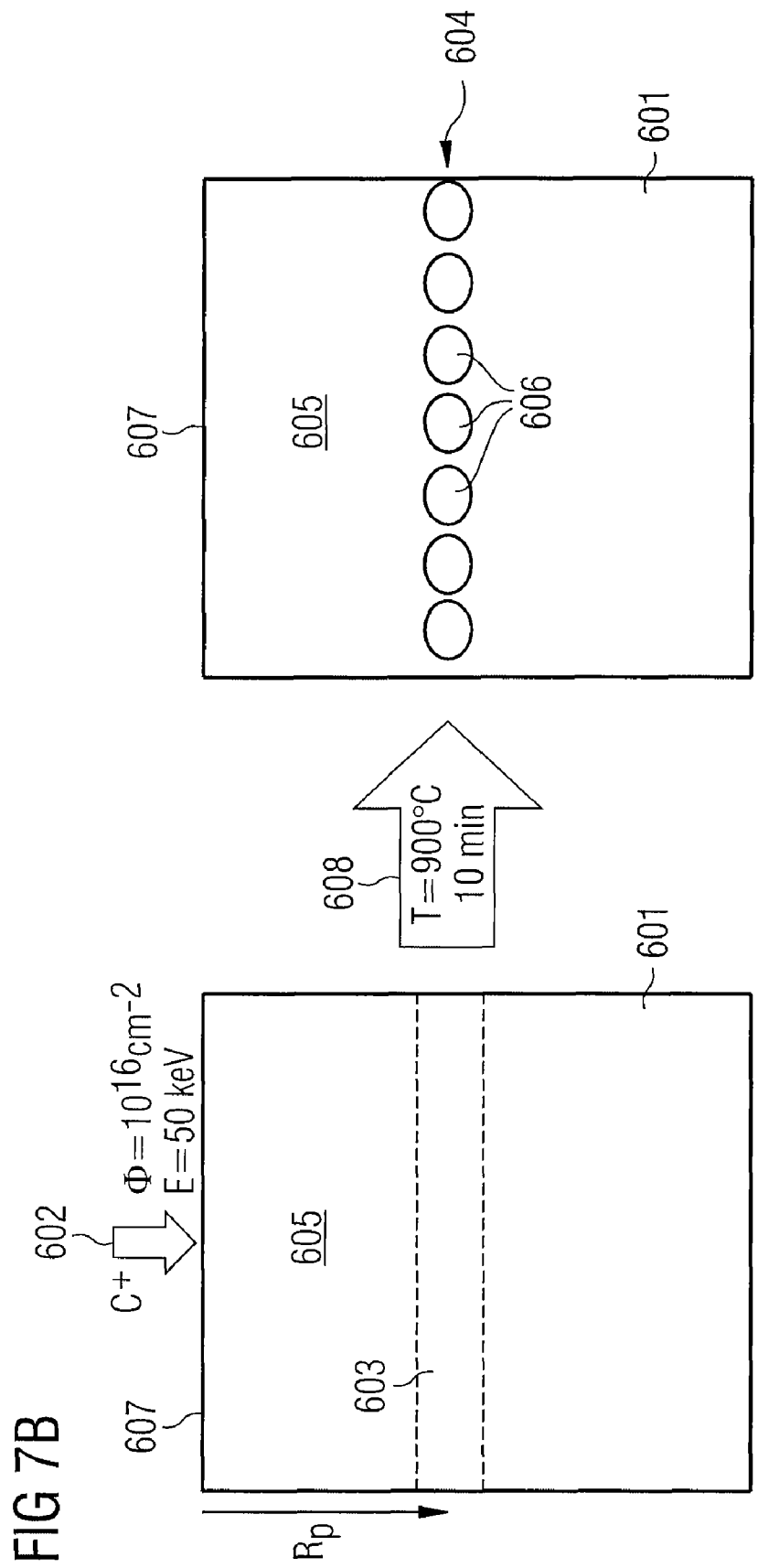

FIG. 7B shows another process step of the method of producing a field effect transistor in accordance with the embodiment of the invention. It is shown the thermal treatment (represented by the arrow 608) of the substrate 601 and the implanted carbon atoms 603, in other words a tempering step or annealing step 608 applied to the substrate 601 and the implanted carbon atoms 603. According to the embodiment shown in FIG. 7B, the annealing step 608 is carried out with a low thermal budget including an annealing temperature of T=900° C. and an annealing time duration of 10 min.

By means of the thermal treatment 608 a network or band 604 of SiC precipitates 606 is formed within the substrate 601 at a depth which corresponds to the projected range $R_p$, the precipitate band 604 including a plurality of separated or isolated, in other words non-connected, silicon carbide precipitates 606, wherein the SiC precipitate band 604 or SiC precipitate layer 604 is oriented roughly in parallel to the substrate surface 607.

Clearly, a band 604 of SiC precipitates 606 is formed at the implanted projected range $R_p$, wherein by means of the thermal treatment 608 the implanted damage resulting from the implantation of carbon ions 602 can be fully annealed, and the silicon carbide nucleation process can be enhanced.

The values of the temperature T and the time duration of the annealing step shown in FIG. 7B serve only as examples and can be tuned or optimized in such a way, that, for example, the density (or concentration) and/or the size of the silicon carbide precipitates 606 do not exceed predeterminable threshold values, such that a delamination of the substrate 601 can be avoided.

Figure 7C:
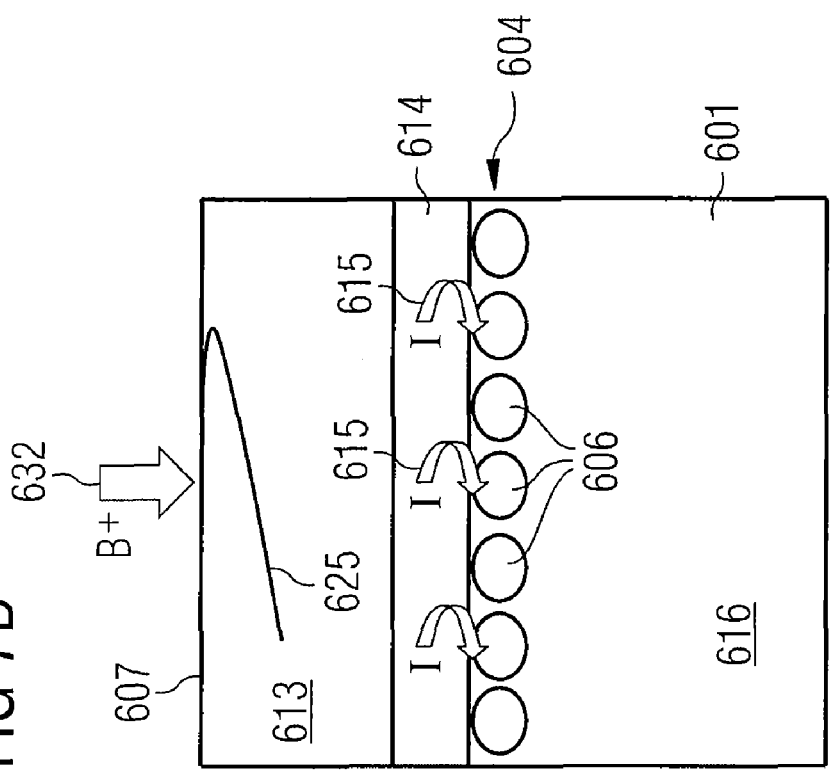

FIG. 7C shows another process step of the method of producing a field effect transistor in accordance with the embodiment of the invention. It is shown, that by means of implanting germanium ions 622 ($Ge^+$ ions 622) the silicon substrate 601 is pre-amorphized. That is, a surface region, for example up to a depth of approximately 50 nm to 200 nm, e.g. 100 nm, is amorphized, such that the silicon substrate 601, which originally may have been a single crystalline substrate, now comprises a crystalline region 616 and an amorphous region 613, wherein the amorphous region 613 extends approximately up to the band 604 of silicon carbide precipitates 606.

In accordance with one embodiment, the average distance between the SiC precipitates 606 and the lower boundary of the amorphous region 613 in the direction of the depth of the substrate 601 can be approximately 10 nm to 20 nm.

The $Ge^+$ ions 622 may be implanted, according to an embodiment, with an implantation dose $\Phi=10^{15}$ $cm^{-2}$ and an implantation energy E=60 keV. According to another embodiment, the germanium pre-amorphization step can be tuned, such that the SiC precipitate region 604 remains approximately 50 nm deeper than the amorphous/crystalline interface, that is the interface between the amorphous region 613 and the crystalline region 616 of the substrate 601.

FIG. 7C shows furthermore, that a region 614 of high self-interstitial supersaturation is formed by the germanium ion implantation 622. As previously indicated, the band 604 of silicon carbide precipitates 606 acts as an effective sink for the interstitials (I) of region 614. In other words, interstitials (I) formed within the region 614 are consumed by the silicon carbide precipitates 606 of the silicon carbide precipitate layer 604, this process being indicated by the arrows 615. Clearly, the SiC rich band 604 effectively suppresses the self-interstitial supersaturation 614 generated by the Ge pre-amorphization step 622.

In this context, it has to be noted that the silicon carbide precipitate region 604 can be formed relatively close to the high self-interstitial supersaturation region 614 but at the same time still far enough away from the amorphous/crystalline interface (not shown in FIG. 7C, cf. reference numeral 108 in FIG. 5), such that a later SPER process step will not be effected.

Figure 7D:
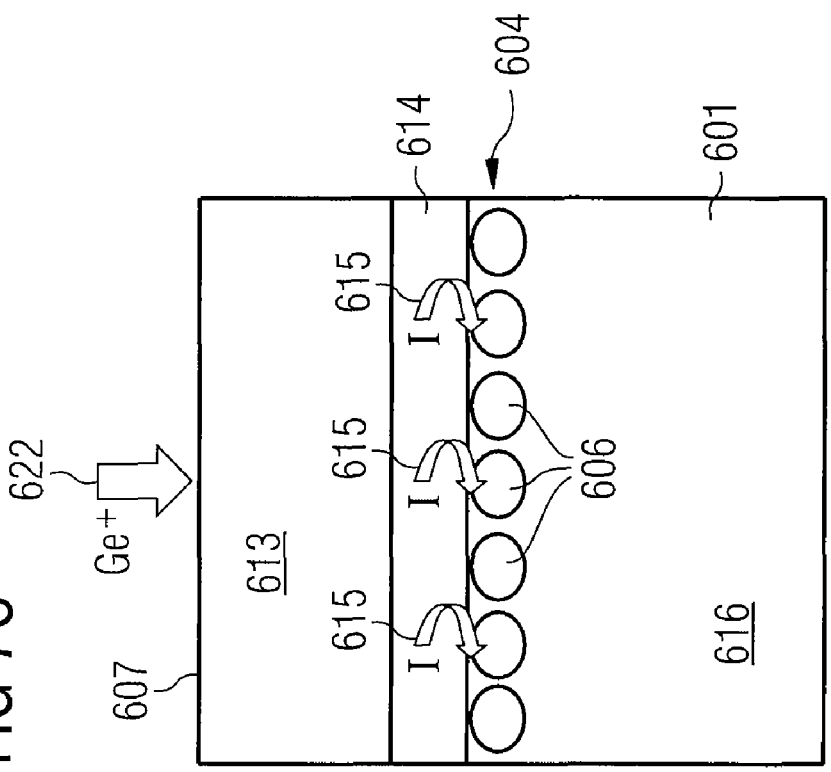

FIG. 7D shows another process step of the method of producing a field effect transistor in accordance with the embodiment of the invention.

It is shown an implantation of elementary boron as dopant atoms into the amorphous region 613 (or at least into parts of the amorphous region 613) of the silicon substrate 601 using $B^+$ ions 632 during the implantation. By means of the implantation of boron, highly doped terminal regions (that is, source/drain regions, not shown in FIG. 7D, cf. reference numerals 831 and 832 in FIG. 8C and FIG. 9C) are formed within the amorphous region 613 of the substrate 601. The implantation of boron atoms into the substrate 601 results in a boron concentration profile schematically illustrated by the curve 625 in FIG. 7D (cf. also the concentration curves 105 in FIG. 1 to FIG. 5). In this context it has to be noted, that the SiC precipitates 606 of the SiC precipitate band 604 may be kept far enough away from the p+/n junctions formed by the implantation of the boron atoms, such that the device performance (that is, the performance of the field effect transistor) is not affected by the silicon carbide precipitates 606. For example, the implantation of the boron atoms may be carried out in such a way that the boron ions ($B^+$ ions) 632 have a kinetic energy of approximately 0.5 keV during implantation.

Figure 8A:
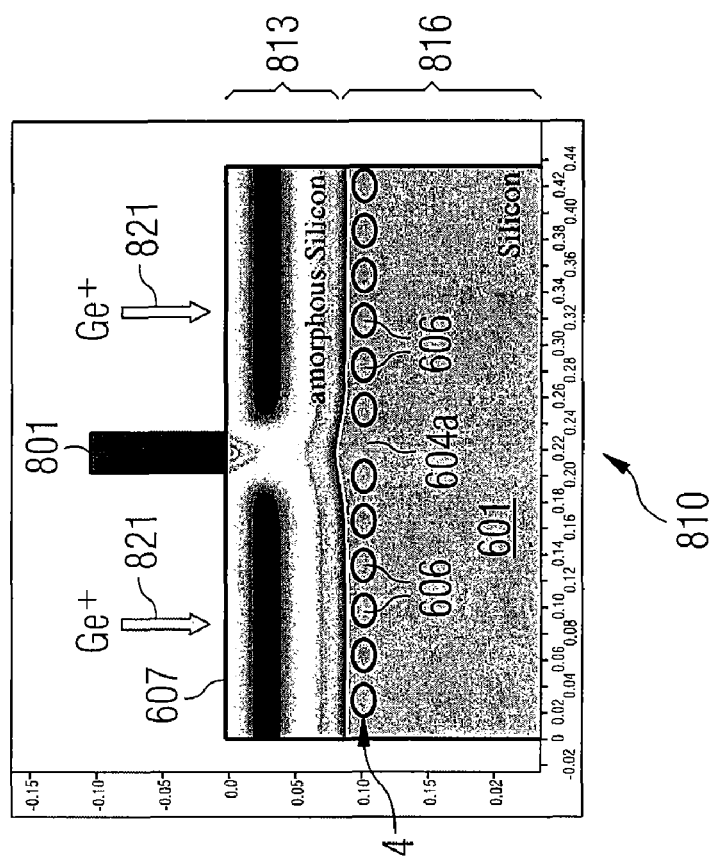
FIG. 8A to FIG. 8C show different process steps of a method of producing a semiconductor element in accordance with an embodiment of the invention.

FIG. 8A shows in a first structure 800 the substrate 601 with the band 604 of silicon carbide precipitates 606, wherein before the formation of the silicon carbide precipitates 606 and thus before an implantation of carbon ions 602 (cf. FIG. 7A), a gate structure 801 (or gate stack 801) has been formed. The carbon ions 602 may be implanted with an implantation dose $\Phi=10^{16}$ $cm^{-2}$, and may have an implantation energy E=50 keV. The gate structure 801 may be formed by a known method, for example, in that the main processing surface 607 of the silicon substrate 601 is oxidized and a polysilicon layer is formed thereon. By means of patterning the polysilicon layer and the silicon dioxide layer the gate structure 801 with the gate oxide and the gate electrode made of polysilicon is formed. The region located beneath the gate structure 801 remains free from carbon ions 602 even after the implantation of those carbon ions 602 since the gate structure 801 serves as a mask during the implantation of the carbon ions 602. After the implantation of the carbon ions 602 the substrate 601 with the gate structure 801 is subjected to the above-described method of forming the SiC precipitates 606 (or the band 604 of SiC precipitates 606), such that the structure 800 shown in FIG. 8A results.

It has to be noted, that the precipitate band structure 604 includes a gap 604a (that is a region, where no precipitates 606 have been formed), which corresponds to the region masked by the gate structure 810 during the carbon ion implantation 602.

Figure 8B:
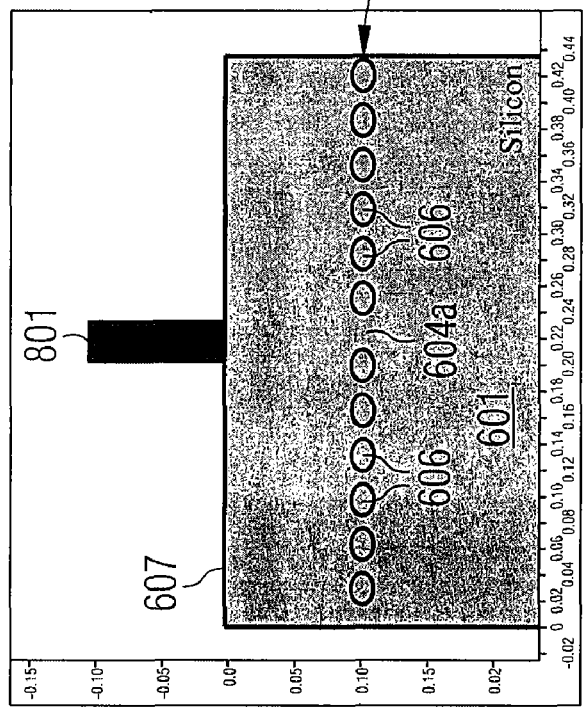

The structure 810 shown in FIG. 8B is obtained, in that the structure 800 shown in FIG. 8A is subjected to a pre-amorphization implantation. The structure 810 is amorphized within its surface region, for example up to a depth of approximately 50 nm to 200 nm, e.g. 100 nm, by means of introducing germanium ($Ge^+$) ions 821 such that the silicon substrate 601, which originally is a single crystalline substrate, now comprises a crystalline region 816 and an amorphous region 813 that extends approximately up to the silicon carbide precipitates 606. An approximate distance between the silicon carbide precipitates 606 and the lower boundary of the amorphous region 813 in the direction of the depth of the substrate 601 may be, for example, approximately 10 nm to 20 nm. The germanium ions 821 may be implanted using an implantation dose of, for example, $\Phi=10^{15}$ cm$^{-2}$ and an implantation energy of, for example, E=60 keV.

Subsequently, by using the gate structure 801 as a mask, a first source/drain region 831 and a second source/drain region 832 are formed within the amorphous region 813 next to the gate structure 801 by means of implanting boron atoms into the amorphous region 813. The implantation of boron is carried out by using B+ ions 833 as implantation ions during implantation. Having formed the source/drain regions 831, 832 in the amorphous region 813, clearly a field effect transistor 820 (see FIG. 8C) is accomplished, which in comparison to conventional field effect transistors has less interstitial-type defects 201. Thus, the TED of boron atoms in the produced field effect transistor 820 is also reduced compared to conventional field effect transistors.

Figure 8C:
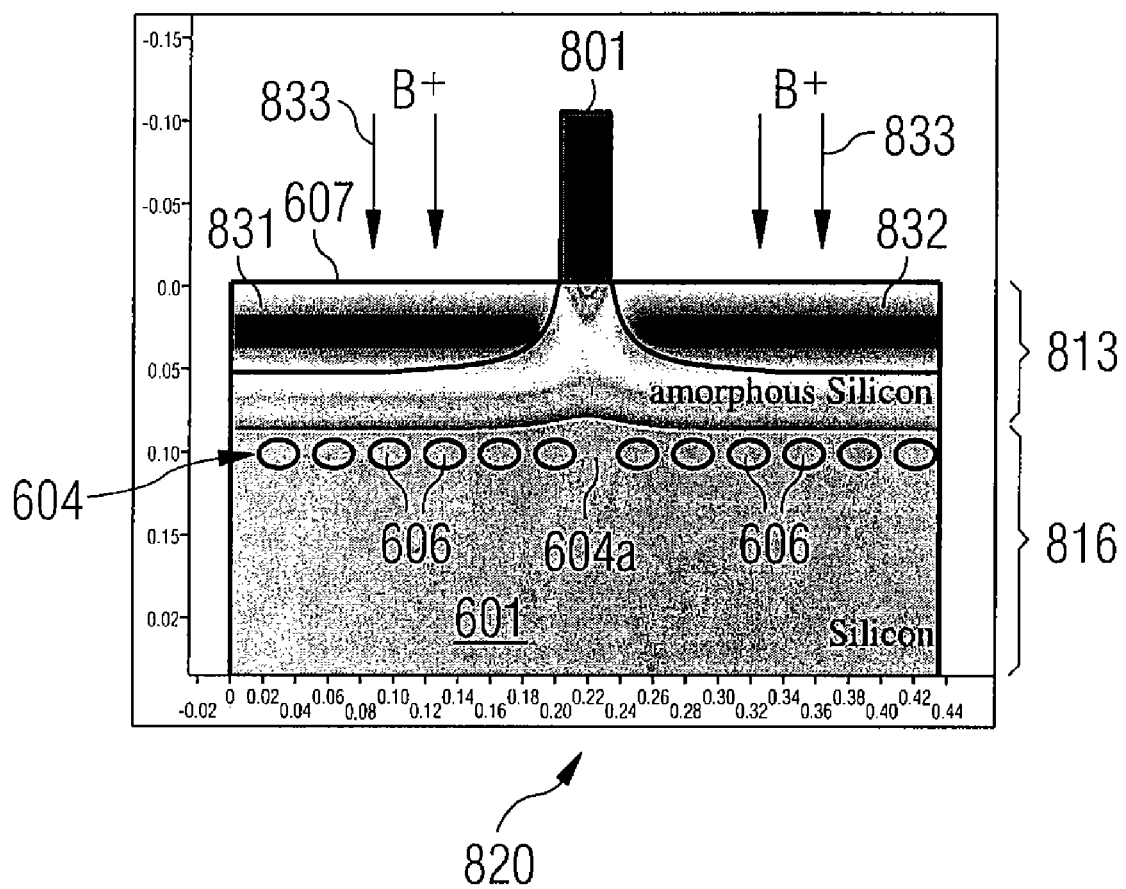

It has to be noted that, according to the embodiment shown in FIG. 8A to FIG. 8C, the implantation of the carbon ions 602 and the subsequent annealing for forming the silicon carbide precipitates 606 is carried out before the pre-amorphization of the substrate 601.

Clearly, according to the embodiment shown, the silicon carbide precipitate band 604 can be integrated within the P-LDD (lightly doped drain) construction. According to one embodiment, the implant conditions of the carbon ion implantation may be chosen to include an implantation dose of, for example, $10^{16}$ carbon ions/cm$^2$ and an implantation energy of, for example, 50 keV, as well as a temperature of, for example, T=900° C. and a time duration of, for example, 10 minutes for the subsequent annealing step. According to one embodiment, the implant conditions for the Ge$^+$ pre-amorphization step may include an implantation dose of, for example, $10^{15}$ germanium ions/cm$^2$ and an implantation energy of, for example, 60 keV. According to one embodiment, the implant conditions for the implantation of boron as dopant atoms may include an implantation dose of, for example, $10^{15}$ boron atoms/cm$^2$ and an implantation energy of, for example, 0.5 keV.

Figure 9A:
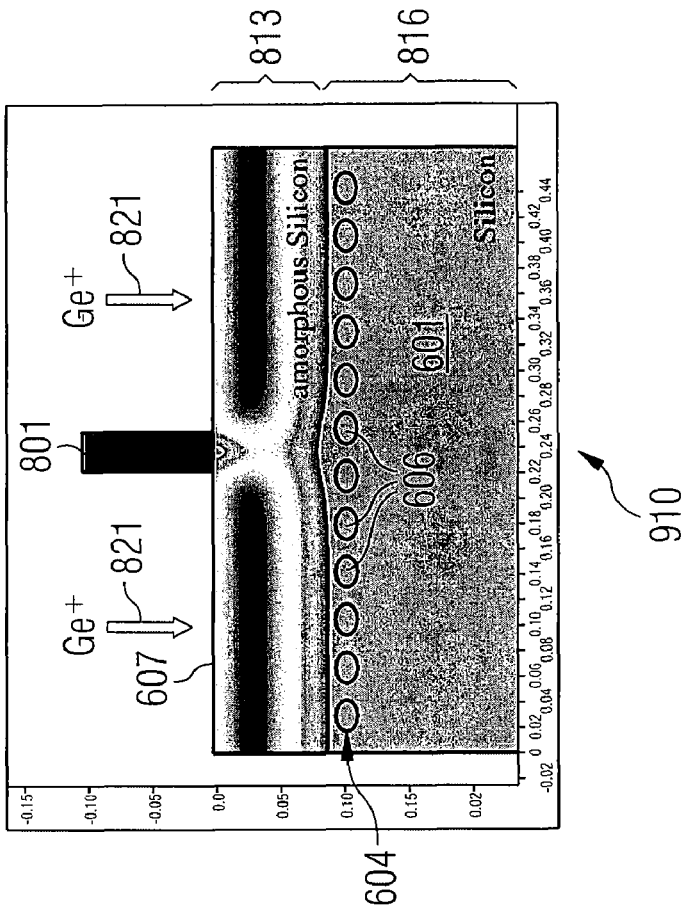
FIG. 9A to FIG. 9C show different process steps of a method of producing a semiconductor element in accordance with another embodiment of the invention.
Figure 9B:
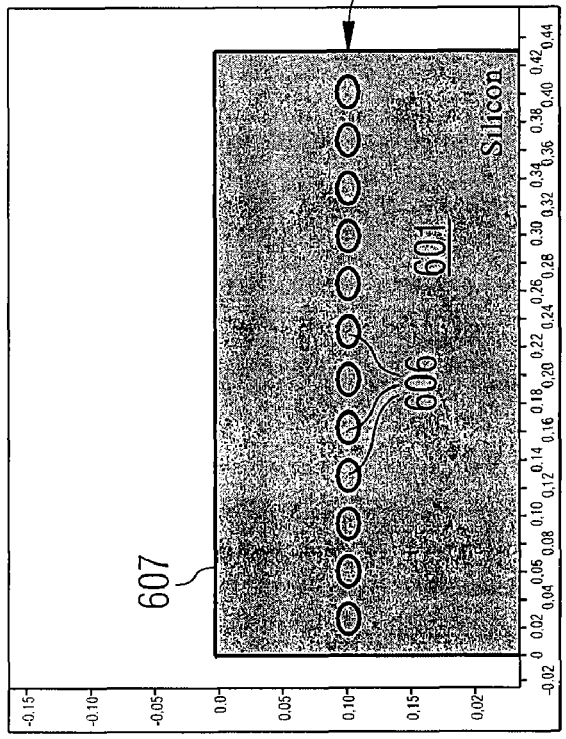
Figure 9C:
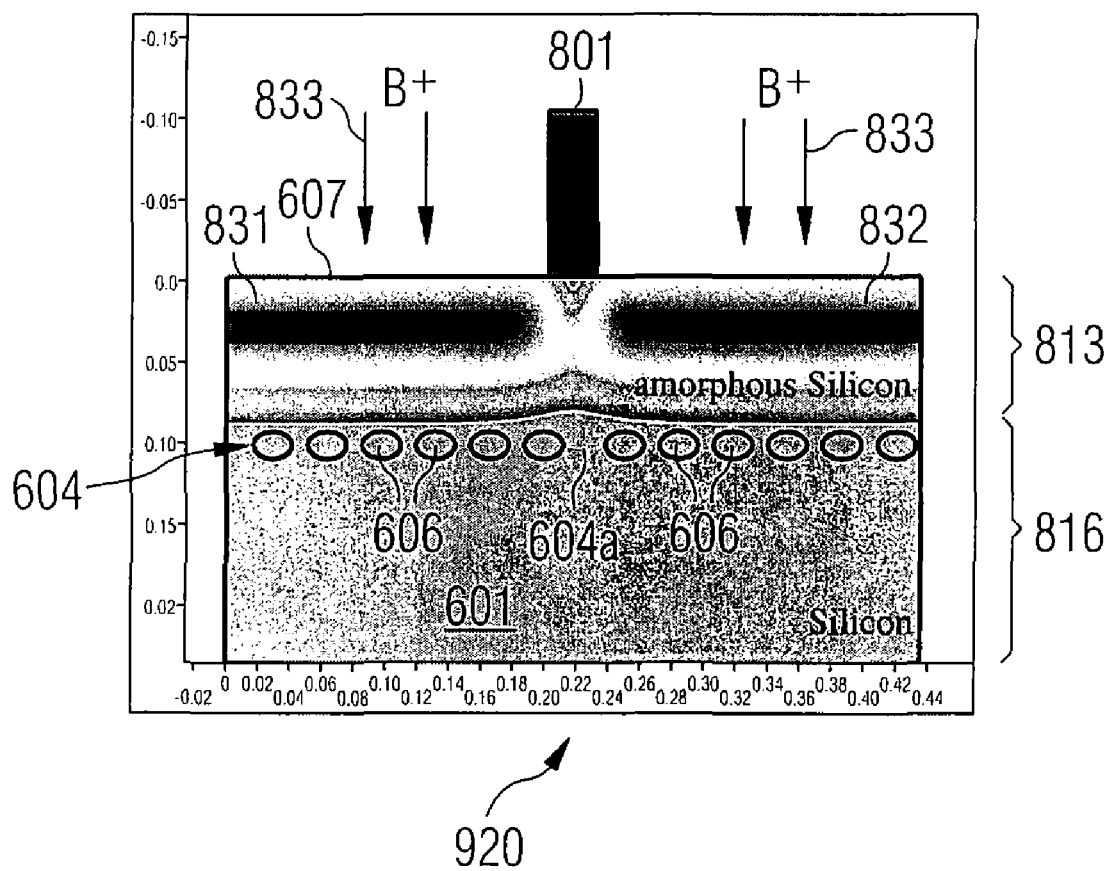

FIG. 9A to FIG. 9C show a method of producing a field effect transistor according to another embodiment of the invention, wherein this embodiment is different from the embodiment shown in FIG. 8A to FIG. 8C, in that the gate structure 801 of the field effect transistor is formed only after the formation of the silicon carbide precipitates 606, wherein however the individual method steps themselves are identical to those of the embodiment described before in connection with FIG. 8A to FIG. 8C, such that a repeated description of these steps in detail is omitted here.

As is shown in FIG. 9A, silicon carbide precipitates 606 are formed in the substrate 601 by means of implanting carbon ions 602 (cf. FIG. 7A) and subsequently annealing the substrate 601 together with the implanted carbon atoms 603 (cf. FIG. 7B). Since in this embodiment, the gate structure 801 is not yet present during the implantation of the carbon ions 602, no masking effect results and thus a continuous band structure 604 of silicon carbide precipitates 606 is formed in the substrate 601, in contrast to the interrupted band structure 604 of the field effect transistor according to the embodiment shown in FIG. 8A to FIG. 8C. In this context, the term "continuous" is to be understood, that the SiC precipitates 606 are not only formed in regions below the source/drain regions 831, 832 but also in a region below the gate structure 801. Thus, there is no gap in the overall band structure 604 as is the case for the embodiment shown in FIG. 8A to FIG. 8C.

After the formation of the SiC precipitates 606, the gate structure 801 is formed, for example in accordance with the method described in connection with FIG. 8A. Subsequently the pre-amorphization of the substrate 601 is carried out by implanting Ge$^+$ ions 821 (see structure 910 in FIG. 9B).

Afterwards, again a first source/drain region 831 and a second source/drain region 832 are formed by means of implanting boron atoms into the amorphized region 813 next to the gate structure 801 using B+ ions 833 as implantation ions and using the gate structure 801 as a mask during implantation. Thus, a field effect transistor 920 (see FIG. 9C) is accomplished, which has less interstitial-type defects 201 in comparison to conventional field effect transistors. In this way, also TED of boron atoms in the formed field effect transistor 920 is reduced compared to conventional field effect transistors.

Thus, according to the embodiment shown in FIG. 9A to FIG. 9C the formation of the silicon carbide precipitate band 604 can be integrated before the gate oxidation process, that is the implantation of the carbon ions 602 and the subsequent annealing step in order to form the SiC precipitate band 604 are carried out before the gate oxidation process.

FIG. 10 shows a method 1000 of producing a semiconductor element in a substrate in accordance with another embodiment of the invention.

In one step 1020 of the method, a plurality of carbide precipitates is formed in the substrate. The carbide precipitates can be formed, for example, in accordance with one of the embodiments described above.

In another step 1040 of the method, doping atoms are implanted into the substrate such that crystal defects are formed in the substrate. The implantation of the doping atoms can be carried out, for example, in accordance with one of the embodiments described above.

In another step 1060 of the method, the substrate is heated such that at least a part of the crystal defects is eliminated using the carbide precipitates. The heating or, in other words, thermal treatment of the substrate can be carried out, for example, in accordance with one of the embodiments described above.

In another step 1080 of the method, the semiconductor element is formed using the doping atoms.

In addition to the foregoing detailed description of exemplary embodiments, further features and effects of certain embodiments of the invention are pointed out in the following:

According to certain embodiments of the invention, process sequences are provided which can be integrated into a conventional CMOS process in a very straightforward way.

No negative effect is created with respect to the performance of the semiconductor element, e.g. the field effect transistor, since the silicon carbide precipitates can be formed having a sufficiently large distance to the p+/n junctions of the ultra-shallow junctions of the semiconductor element.

In accordance with some embodiments of the invention, the TED and the deactivation of the dopant atoms can be considerably reduced as a direct consequence of the reduction of EOR defects.

In accordance with some embodiments of the invention, ultra-fast thermal processes such as, for example, laser annealing or flash annealing can be carried out at a temperature of less than 1300° C., such that dielectric degradation problems are avoided.

In accordance with one embodiment of the invention, a rapid thermal anneal (RTA) can be used instead of a laser annealing or flash annealing.

In accordance with one embodiment of the invention, a high implantation dose of carbon ions is integrated into a conventional CMOS process, wherein the carbon ions form silicon carbide precipitates in a region of the substrate in which EOR defects are formed.

In accordance with some embodiments of the invention, these silicon carbide precipitates remain stable during a gate oxidation process and are subjected to a competing ripening process with interstitial-type defects during the high temperature annealing process (e.g. laser or flash annealing). The probability of eliminating interstitial-type defects (as for example dislocation loops or {113} defects) depends on the density as well as on the size of the silicon carbide precipitates. The bigger the silicon carbide precipitates are the greater is the probability that the dislocation loops dissolve.

The competition between silicon carbide precipitates and interstitial-type defects starts at the beginning of the RTP annealing process. Since the surface energy of the silicon carbide precipitates is approximately equivalent to the surface energy of the silicon surface, the dislocation loops are less favorable in energetic terms, and for this reason a flux of interstitial-type defects in the direction towards the silicon carbide precipitates will start.

According to one embodiment of the invention, a method of producing a semiconductor element is provided, wherein by means of the method the silicon surface is brought nearer to the EOR defects.

Under the condition, that the silicon carbide precipitates are kept sufficiently far away from the p+/n junctions, no negative effect of the method on the performance of the semiconductor element is caused.

According to one embodiment, only slight modifications in the process flow of a conventional CMOS process are required. In one embodiment, in order to keep the silicon carbide precipitate layer away from the junction, the energy of the pre-amorphization implants can be slightly increased.

According to another embodiment of the invention, the peak annealing temperature of an ultra-fast thermal process can be significantly reduced below 1300° C.

One of the reasons for using extremely high temperatures is to reduce TED and to increase the level of dopant activation.

As has been already described, by the creation of a sink for interstitial-type defects both TED and dopant deactivation can be reduced or eliminated, and for this reason high-temperature processes are no longer needed. This offers a variety of possibilities for choosing the most suitable RTP method.

In accordance with one embodiment of the invention, the term "carbide precipitates" as used herein may refer to silicon carbide (SiC) precipitates, for example to the beta-SiC phase, although other carbide structures or phases may also be included. According to some embodiments, for example, the term "carbide precipitates" may also comprise any agglomeration of carbon atoms in the matrix, such as pure carbon clusters, or may even involve precipitates comprising oxygen atoms such as silicon-oxygen-carbon precipitates, for example.

While the invention has been shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes that come within the meaning and range of equivalency of the claims are intended to be embraced.

What is claimed is:

1. A method of producing a semiconductor element in a substrate, comprising:
    forming a plurality of carbide precipitates in the substrate;
    implanting doping atoms into the substrate, thereby forming crystal defects in the substrate; and
    heating the substrate, such that at least a portion of the crystal defects is eliminated using the carbide precipitates,
    wherein the semiconductor element is formed using the doping atoms.

2. The method according to claim 1, wherein the step of forming the plurality of carbide precipitates in the substrate includes implanting carbon ions into the substrate.

3. The method according to claim 1, wherein the plurality of carbide precipitates form a band and are separated from one another.

4. The method according to claim 2, wherein the carbon ions are implanted with an implantation dose of approximately between $10^{14}$ cm$^{-2}$ and $10^{18}$ cm$^{-2}$.

5. The method according to claim 2, wherein the carbon ions are implanted such that they have an energy of approximately between 10 keV and 100 keV during implantation.

6. The method according to claim 2, wherein the step of forming the plurality of carbide precipitates in the substrate further includes subjecting the implanted carbon ions to a thermal treatment.

7. The method according to claim 6, wherein the step of subjecting the implanted carbon ions to a thermal treatment includes heating the substrate to a temperature of approximately between 600° C. and 1000° C.

8. The method according to claim 7, wherein the substrate is heated for a duration of approximately between 5 minutes and 4 hours during the thermal treatment.

9. The method according to claim 1, further comprises partially pre-amorphizing the substrate.

10. The method according to claim 9, wherein the step of partially pre-amorphizing the substrate includes using pre-amorphization ions.

11. The method according to claim 10, wherein the pre-amorphization ions are germanium ions or silicon ions.

12. The method according to claim 9, wherein the step of partially pre-amorphizing the substrate is performed after the step of forming the plurality of carbide precipitates.

13. The method according to claim 9, wherein the carbide precipitates are formed near an interface between a crystalline region of the substrate and an amorphous region of the substrate formed by the partial pre-amorphization.

14. The method according to claim 1, wherein the doping atoms are boron atoms, phosphorus atoms or arsenic atoms.

15. The method according to claim 14, wherein the doping atoms are boron atoms, and the step of implanting the boron atoms includes introducing boron ions into the substrate, or introducing boron fluoride ions into the substrate, or introducing boron clusters into the substrate.

16. The method according to claim 1, wherein at least one region, within which region the doping atoms are implanted into the substrate, forms a shallow junction of the semiconductor element.

17. The method according to claim 1, wherein the semiconductor element is a transistor.

18. The method according to claim 17, wherein the semiconductor element is a field effect transistor.

19. The method according to claim 18, wherein at least one region, within which region the doping atoms are implanted into the substrate, forms a source region or a drain region of the field effect transistor.

20. The method according to claim 19, wherein a first region, within which the doping atoms are implanted into the substrate, forms a source region of the field effect transistor, and wherein a second region, within which the doping atoms are implanted into the substrate, forms a drain region of the field effect transistor.

21. The method according to claim 1, wherein the substrate is a silicon substrate.

22. The method according to claim 21, wherein the substrate is a (100) silicon substrate or a (111) silicon substrate.

23. The method according to claim 18, wherein the step of forming the plurality of carbide precipitates occurs prior to forming a gate insulator of the field effect transistor.

24. The method according to claim 18, wherein the step of forming the plurality of carbide precipitates occurs after forming a gate insulator of the field effect transistor.

25. A semiconductor element, comprising:
a substrate;
at least one shallow junction formed in the substrate;
doping atoms formed in the shallow junction; and
a plurality of carbide precipitates formed in the substrate below the at least one shallow junction.

26. The semiconductor element according to claim 25, wherein the at least one shallow junction is formed within an amorphous region of the substrate.

27. The semiconductor element according to claim 25, wherein the plurality of carbide precipitates are formed near an interface between a crystalline region of the substrate and an amorphous region of the substrate.

28. The semiconductor element according to claim 25, the semiconductor element being a transistor.

29. The semiconductor element according to claim 28, the semiconductor element being a field effect transistor.

30. The semiconductor element according to claim 29, wherein the at least one shallow junction forms the source region or the drain region of the field effect transistor.

31. The semiconductor element according to claim 27, wherein the doping atoms are boron atoms.

* * * * *